United States Patent
Satou et al.

(10) Patent No.: US 6,222,231 B1
(45) Date of Patent: Apr. 24, 2001

(54) SEMICONDUCTOR DEVICE OF HIGH BREAKDOWN VOLTAGE USING SEMICONDUCTIVE FILM AND ITS MANUFACTURING METHOD

(75) Inventors: Shingo Satou, Kawasaki; Masanobu Tsuchitani, Fuchu, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/512,319

(22) Filed: Feb. 24, 2000

(30) Foreign Application Priority Data

Feb. 25, 1999 (JP) .................................. 11-047989

(51) Int. Cl.[7] ........................... H01L 29/76; H01L 29/94; H01L 31/062; H01L 31/113
(52) U.S. Cl. .......................... 257/329; 257/339; 257/487
(58) Field of Search .................... 257/329, 339, 257/487

(56) References Cited

U.S. PATENT DOCUMENTS 5,410,177    4/1995   Harmel et al. .
5,770,878  * 6/1998   Beasom ................................ 257/330

FOREIGN PATENT DOCUMENTS 10-242457    9/1998   (JP) .

* cited by examiner

*Primary Examiner*—Ngân V. Ngô
(74) *Attorney, Agent, or Firm*—Finnegan, Henderson, Farabow, Garrett & Dunner, L.L.P.

(57) ABSTRACT

Continuously after forming a semiconductive film, a conducting film is formed on the semiconductive film. This conducting film serves as a block film for blocking diffusion of oxygen when a heated wafer is transferred from a furnace to the atmosphere. As a result, oxygen is prevented from entering the semiconductive film from the outside and diffusing therein. Further, after protecting the semiconductive film, the conducting film is entirely removed by etching.

6 Claims, 2 Drawing Sheets

SEMICONDUCTOR DEVICE OF HIGH BREAKDOWN VOLTAGE USING SEMICONDUCTIVE FILM AND ITS MANUFACTURING METHOD

CROSS-REFERENCE TO RELATED APPLICATION

This application is based upon and claims the benefit of priority from the prior Japanese Patent Application No. 11-047989, filed Feb. 25, 1999, the entire contents of which are incorporated herein by reference.

BACKGROUND OF THE INVENTION

This invention relates to a semiconductor element of a high voltage applied to, for example, a MOS transistor, an IGBT (Insulated Gate Bipolar Transistor), etc., and more particularly to a semiconductor device of a junction terminal structure and its manufacturing method.

In semiconductor devices of a high voltage, a high electric field may be locally generated and breakdown may occur depending upon the shape of a junction or by the influence of an external charge. To prevent such breakdown, a semiconductive film such as a polysilicon layer is formed on the surface of a semiconductor area of a low impurity density which will serve as a depletion layer.

As shown in FIG. 7, first, ion implantation and diffusion is executed in, for example, an n-type semiconductor substrate 11. As a result, for example, a p-type anode layer 12 is selectively formed in a surface of the semiconductor substrate 11, and, for example, an n⁺-type channel stopper layer 13 is selectively formed in the same surface of the substrate 11 with a predetermined distance from the anode layer 12. Further, an n⁺-type cathode layer 14 is formed on the reverse surface of the semiconductor substrate 11.

Subsequently, a thermally oxidized film (not shown) is formed on the semiconductor substrate 11 by thermal oxidation. Then, that portion of the thermally oxidized film, which is located between the anode layer 12 and the channel stopper layer 13, is etched.

After that, a semiconductive film 15 with a thickness of, for example, 1.5 $\mu$m is formed by low pressure CVD on the entire top surface of the resultant structure. Then, those portions of the semiconductive film 15, which are located on the anode layer 12 and the channel stopper layer 13, are etched, and the semiconductive film on the reverse surface is selectively etched.

Thereafter, an oxide film 17 is formed on the entire top surface of the resultant structure by atmospheric pressure CVD. Then, those portions of the thermally oxidized film and the oxide film 17, which are located on the anode layer 12 and the channel stopper layer 13, are etched.

In the next stage, a metallic film formed of, for example, aluminum is provided on the entire top surface. This metallic film is then selectively etched so as to expose the surface of the oxide film 17. As a result, an anode electrode 18 connected to the anode layer 12 and a channel stopper electrode 19 connected to the channel stopper layer 13 are formed.

Lastly, a cathode electrode 20 made of, for example, aluminum is formed on the reverse surface of the semiconductor substrate 11.

The semiconductive film 15 is formed by low pressure CVD and mixed with oxygen, for example, of a predetermined density. However, since the film is formed by a high temperature treatment, it is in a state in which oxygen is liable to diffuse until, for example, it reaches a density higher than a predetermined value and a position out of a predetermined range. Accordingly, while transferring it from the furnace to the outside air, oxygen is absorbed from the atmosphere and diffuses to a deep portion of the semiconductive film 15 heated to a high temperature, whereby the semiconductive film 15 inevitably has an area of high oxygen concentration. As a result, as is shown in FIG. 8, the area in which the oxygen concentration varies extends from the surface of the semiconductive film 15 to a depth of about 1 $\mu$m, whereas an area in which the oxygen concentration is constant extends over a length of only 0.5 $\mu$m in the depth direction.

Therefore, when implanting carriers into the semiconductive film 15, they are trapped in a high oxygen concentration area located at an upper portion of the film 15. The charge accumulated in this area disturbs an electric field generated in the device under the semiconductive film, thereby degrading the breakdown voltage. Furthermore, since the semiconductive film 15 has a small area of constant oxygen concentration, the device shows a high resistivity.

BRIEF SUMMARY OF THE INVENTION

The present invention has been developed to solve the above-described problems, and aims to provide a semiconductor device capable of suppressing diffusion of oxygen in a semiconductive film to thereby minimize degradation of its breakdown voltage, and also to provide a method of manufacturing the semiconductor device.

To attain the aim, the invention uses the following means.

A first semiconductor device according to the invention comprises an element area formed in a surface of a semiconductor substrate and having a high voltage element; an anode layer formed in a surface of the element area of the semiconductor substrate; a channel stopper layer formed in a junction terminal section with a predetermined distance from the anode layer; a semiconductive film formed on the semiconductor substrate between the anode layer and the channel stopper layer; and a first insulating film covering the semiconductive film, wherein an area of the semiconductive film, in which the concentration of oxygen is constant, has a thickness sufficient to keep an electric field undisturbed.

A second semiconductor device according to the invention comprises an element area formed in a surface of a semiconductor substrate and having a high voltage element; an anode layer formed in a surface of the element area of the semiconductor substrate; a channel stopper layer formed in a junction terminal section with a predetermined distance from the anode layer; a semiconductive film formed on the semiconductor substrate between the anode layer and the channel stopper layer; a first insulating film covering the semiconductive film; and a second insulating film formed between the semiconductive film and the first insulating film, wherein an area of the semiconductive film, in which the concentration of oxygen is constant, has a thickness sufficient to keep an electric field undisturbed.

In the above-described first and second semiconductor devices, the semiconductive film is formed of a material obtained by adding at least one of oxygen, nitrogen and carbon to silicon. Further, the semiconductive film has a specific resistance of $10^7$–$10^{13}$ Ω·cm. Moreover, the concentration of oxygen contained in an area of the semiconductive film is constant, which is located at a distance of 1 $\mu$m or more from the surface of the semiconductor substrate.

A first method of manufacturing a semiconductor device according to the invention comprises the steps of: selectively forming a first area of a second conductivity type in one surface of a semiconductor substrate of a first conductivity type; selectively forming a second area of a first conductivity type in the one surface of the semiconductor substrate with a predetermined distance from the first area; selectively forming a third area of the first conductivity type in another surface of the semiconductor substrate; forming a first insulating film on the semiconductor substrate; removing that portion of the first insulating film which is located between the first and second areas; forming a semiconductive film on the entire one surface of the resultant structure in a first furnace; forming a conducting film on the semiconductive film in the first furnace continuously the forming of the semiconductive film; carrying a wafer with the resultant structure out of the first furnace to thereby reduce the temperature of the wafer; carrying the wafer into a second furnace to remove the entire conducting film; removing those portions of the semiconductive film which are located on the first and second areas; forming a second insulating film on the resultant structure; and removing those portions of the first and second insulating films which are located on the first and second areas.

In the first method of the invention, the semiconductive film is formed of a material obtained by adding at least one of oxygen, nitrogen and carbon to silicon. Further, the semiconductive film has a specific resistance of $10^7$–$10^{13}$ Ω·cm. Moreover, the concentration of oxygen contained in an area of the semiconductive film is constant, which is located at a distance of 1 μm or more from the one surface of the semiconductor substrate.

A second method of manufacturing a semiconductor device according to the invention comprises the steps of: selectively forming a first area of a second conductivity type on a semiconductor substrate of a first conductivity type; selectively forming a second area of a first conductivity type in one surface of the semiconductor substrate with a predetermined distance from the first area; selectively forming a third area of the first conductivity type in another surface of the semiconductor substrate; forming a first insulating film on the semiconductor substrate; removing that portion of the first insulating film which is located between the first and second areas; forming a semiconductive film on the entire one surface of the resultant structure in a first furnace; forming a second insulating film on the semiconductive film in the first furnace continuously the forming of the semiconductive film; carrying a wafer with the resultant structure out of the first furnace to thereby reduce the temperature of the wafer; carrying the wafer into a second furnace to remove those portions of the semiconductive film and the second insulating film, which are located on the first and second areas; forming a third insulating film on the resultant structure; and removing those portions of the first and third insulating films which are located on the first and second areas.

In the second method of the invention, the semiconductive film is formed of a material obtained by adding at least one of oxygen, nitrogen and carbon to silicon. Further, the semiconductive film has a specific resistance of $10^7$–$10^{13}$ Ω·cm. Moreover, the concentration of oxygen contained in an area of the semiconductive film is constant, which is located at a distance of 1 μm or more from the one surface of the semiconductor substrate. In addition, the semiconductive film and the second insulating film are formed by low pressure CVD.

As described above, the invention provides a semiconductor device in which diffusion of oxygen in the semiconductive film is suppressed, thereby minimizing degradation of the breakdown voltage of the device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the invention will be described with reference to the accompanying drawings.

[First Embodiment]

A first embodiment of the invention will now be described.

Figure 1:
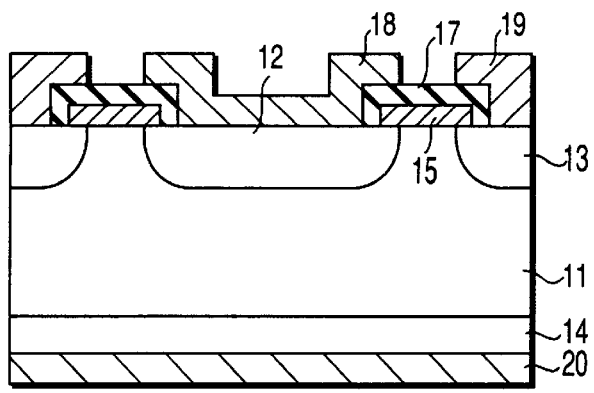
FIG. 1 is a sectional view showing a semiconductor device according to a first embodiment of the invention.

As is shown in FIG. 1, p-type ions, for example, are implanted and diffused into an n-type semiconductor substrate 11, thereby selectively forming a p-type anode layer 12 in a surface of the semiconductor substrate 11. The semiconductor substrate 11 has a specific resistance ρ of, for example, 170Ω·cm and a thickness of, for example, 625 μm. If the p-type ions are boron (B) ions, they are implanted at an acceleration voltage of 60 keV with a dose of 1×10$^{14}$ions/cm$^2$. Further, the ions are diffused in the atmosphere of nitrogen at a temperature of, for example, 1150° C. for, for example, 60 minutes.

Subsequently, n-type ions, for example, are implanted and diffused, thereby selectively forming an n$^+$-type channel stopper layer 13 in the same surface of the semiconductor substrate 11 with a predetermined distance from the anode layer 12. If the n-type ions are As ions, they are implanted at an acceleration voltage of 40 keV with a dose of 1×10$^{15}$ions/cm$^2$. Further, the ions are diffused in the atmosphere of oxygen at a temperature of, for example, 1000° C.

for, for example, 20 minutes. After that, a cathode layer 14 of, for example, an n$^+$-type is formed on the reverse surface of the semiconductor substrate 11.

Thereafter, a thermally oxidized film (not shown) having a thickness of, for example, 400 nm is formed on the ion-implanted surface of the semiconductor substrate 11 by thermal oxidation. Then, that portion of the thermally oxidized film, which is located between the anode layer 12 and the channel stopper layer 13, is etched.

After that, a semiconductive film 15 with a thickness of, for example, 1.5 μm is formed on the entire top surface of the resultant structure by low pressure CVD at a high film-forming temperature of, for example, 700° C. The semiconductive film 15 is formed of a material obtained by adding at least one of oxygen, nitrogen and carbon to silicon. To secure an area with constant oxygen concentration in the semiconductive film 15, it is preferable that the semiconductive film 15 has a specific resistance of $10^7$–$10^{13}$ Ω·cm. After that, a conducting film (not shown) such as, for example, a polysilicon film is formed on the semiconductive film 15. This conducting film is formed continuously the semiconductive film 15 in the same furnace as that used to form the semiconductive film 15.

Subsequently, a wafer with the resultant structure is carried out of the furnace to reduce the temperature of the wafer. Since at this time, a conducting film is provided on the semiconductive film 15, oxygen in the atmosphere does not enter the semiconductive film 15. Then, the entire conducting film is removed by etching, and those portions of the semiconductive film 15, which are located on the anode layer 12 and the channel stopper layer 13, are etched.

Then, an oxide film 17 is formed on the entire top surface of the resultant structure by atmospheric pressure CVD. Since this process does not require a high temperature, oxygen scarcely diffuses in the semiconductive film 15.

After that, those portions of the thermally oxidized film and the oxide film 17, which are located on the anode layer 12 and the channel stopper layer 13, are etched by RIE.

A metallic film such as an aluminum film is formed on the entire top surface of the resultant structure. This metallic film is then selectively etched so as to expose the surface of the oxide film 17. As a result, an anode electrode 18 that contacts the anode layer 12 and a channel stopper electrode 19 that contacts the channel stopper layer 13 are formed.

Lastly, a cathode electrode 20 made of, for example, aluminum is formed on the reverse surface of the semiconductor substrate 11.

Figure 2:
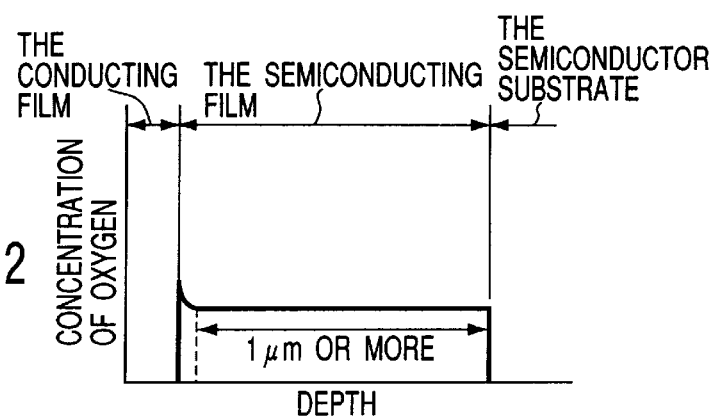
FIG. 2 is a graph relating to the first embodiment and illustrating the relationship between the concentration of oxygen and the depth of a semiconductive film from its surface.

In the above-described first embodiment, the conducting film functions as a block film for blocking the introduction of oxygen from the outside while the wafer heated to a high temperature is transferred from the inside to the outside of the furnace. As a result, diffusion of oxygen in the semiconductive film 15 is suppressed, thereby limiting an area in which the concentration of oxygen varies, to a depth of about 0.1 μm from the surface of the semiconductive film 15, and securing an area with a depth-directional length of 1 μm or more in which the oxygen concentration is constant, as is shown in FIG. 2. This means that oxygen concentration varies in only a small area, and hence trap of charge, which will occur when carriers enter such an area in the semiconductive film 15, can be minimized. Accordingly, the electric field under the semiconductive film 15 is prevented from disturbance, whereby degradation of the breakdown voltage of the device can be avoided. Further, since the area in which the oxygen concentration is constant can be secured over the depth-directional length of 1 μm or more, increase of the specific resistance can be suppressed.

Moreover, since the conducting film is removed by etching after protecting the semiconductive film 15, the specific resistance of the semiconductive film 15 does not decrease, and hence occurrence of leakage of current can be minimized.

[Second Embodiment]

A second embodiment of the invention will be described. In this embodiment, elements similar to those employed in the first embodiment are denoted by corresponding reference numerals.

Figure 3:
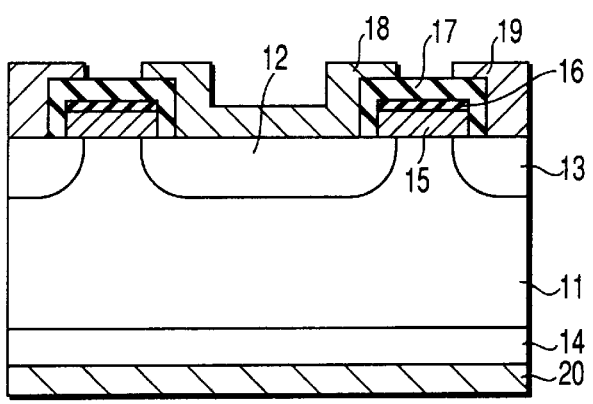
FIG. 3 is a sectional view showing a semiconductor device according to a second embodiment of the invention.

As is shown in FIG. 3, p-type ions, for example, are implanted and diffused into an n-type semiconductor substrate 11, thereby selectively forming a p-type anode layer 12 in a surface of the semiconductor substrate 11. The semiconductor substrate 11 has a specific resistance ρ of, for example, 170Ω·cm and a thickness of, for example, 625 μm. If the p-type ions are boron (B) ions, they are implanted at an acceleration voltage of 60 keV with a dose of $1\times10^{14}$ ions/cm$^2$. Further, the ions are diffused in the atmosphere of nitrogen at a temperature of, for example, 1150 ° C. for, for example, 60 minutes.

Subsequently, n-type ions, for example, are implanted and diffused, thereby selectively forming an n$^+$-type channel stopper layer 13 in the same surface of the semiconductor substrate 11 with a predetermined distance from the anode layer 12. If the n-type ions are AS ions, they are implanted at an acceleration voltage of 40 keV with a dose of $1\times10^{15}$ ions/cm$^2$. Further, the ions are diffused in the atmosphere of oxygen at a temperature of, for example, 1000° C. for, for example, 20 minutes. After that, a cathode layer 14 of, for example, an n$^+$-type is formed on the reverse surface of the semiconductor substrate 11.

Thereafter, a thermally oxidized film (not shown) having a thickness of, for example, 400 nm is formed on the ion-implanted surface of the semiconductor substrate 11 by thermal oxidation. Then, that portion of the thermally oxidized film, which is located between the anode layer 12 and the channel stopper layer 13, is etched.

After that, a semiconductive film 15 with a thickness of, for example, 1.5 μm is formed on the entire top surface of the resultant structure by low pressure CVD at a high film-forming temperature of, for example, 700° C. The semiconductive film 15 is formed of a material obtained by adding at least one of oxygen, nitrogen and carbon to silicon. To secure an area with a constant oxygen concentration in the semiconductive film 15, it is preferable that the semiconductive film 15 has a specific resistance of $10^7$–$10^{13}$ Ω·cm. After that, an oxide film 16, for example, is formed on the semiconductive film 15 by low pressure CVD. The oxide film 16 is formed continuously the semiconductive film 15 in the same furnace as that used to form the semiconductive film 15. A nitrogen film, for example, may be used in place of the oxide film 16.

Subsequently, a wafer with the resultant structure is carried out of the furnace to reduce the temperature of the wafer. Since at this time, the oxide film 16 is provided on the semiconductive film 15, oxygen in the atmosphere does not enter the semiconductive film 15. Then, those portions of the semiconductive film 15 and the oxide film 16, which are located on the anode layer 12 and the channel stopper layer 13, are etched.

Then, an oxide film 17 is formed on the entire top surface of the resultant structure by atmospheric pressure CVD. Since this process does not require a high temperature, oxygen scarcely diffuses in the semiconductive film 15.

After that, those portions of the thermally oxidized film and the oxide film 17, which are located on the anode layer 12 and the channel stopper layer 13, are etched by atmospheric pressure CVD.

A metallic film such as an aluminum film is formed on the entire top surface of the resultant structure. This metallic film is then selectively etched so as to expose the surface of the oxide film 17. As a result, an anode electrode 18 that contacts the anode layer 12 and a channel stopper electrode 19 that contacts the channel stopper layer 13 are formed.

Lastly, a cathode electrode 20 made of, for example, aluminum is formed on the reverse surface of the semiconductor substrate 11.

Figure 4:
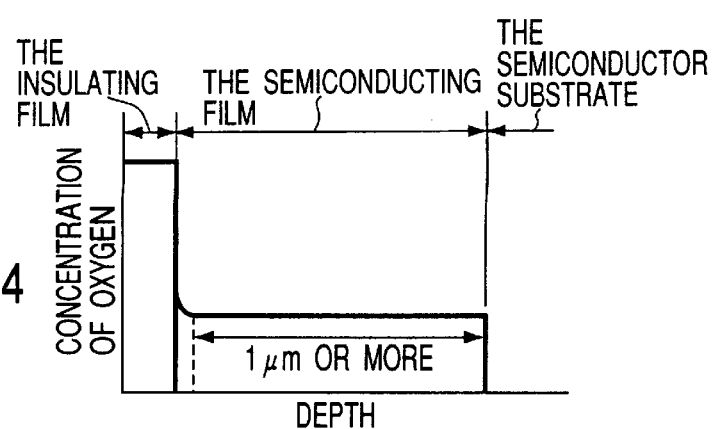
FIG. 4 is a graph relating to the second embodiment and illustrating the relationship between the concentration of oxygen and the depth of a semiconductive film from its surface.

In the above-described second embodiment, the oxide film 16 blocks the introduction of oxygen from the outside while the wafer heated to a high temperature is transferred from the inside to the outside of the furnace. As a result, diffusion of oxygen in the semiconductive film 15 is suppressed, thereby limiting an area in which the concentration of oxygen varies, to a depth of about 0.1 $\mu$m from the surface of the semiconductive film 15, and securing an area with a depth-directional length of 1 $\mu$m or more in which the oxygen concentration is constant, as is shown in FIG. 4. This means that the concentration of oxygen varies in only a small area, and hence trap of charge, which will occur when carriers enter such an area in the semiconductive film 15, can be minimized. Accordingly, the electric field under the semiconductive film 15 is prevented from disturbance, whereby degradation of the breakdown voltage of the device can be avoided. Further, since the area in which the oxygen concentration is constant can be secured over the depth-directional length of 1 $\mu$m or more, increase of the specific resistance can be suppressed.

Moreover, since the semiconductive film 15 is protected with the oxide film 16 of a high resistance, the entire film structure consisting of the semiconductive film 15 and the oxide film 16 is free from the problem of a reduction in specific resistance.

As described above, in the first and second embodiments, an area, in which the concentration of oxygen varies and which will cause charge trap, can be distance from the surface of the semiconductor substrate 11 by a distance twice or more the distance in the conventional case, without changing the specific resistance of the semiconductive film 15. Accordingly, degradation of the breakdown voltage and increase of leakage current can be suppressed without disturbing a depletion layer that is generated when a reverse bias has been applied to the semiconductor device.

Although the depth of an area in which the concentration of oxygen is constant varies depending upon the thickness of the semiconductive film 15, this area is made to a sufficient thickness so as to suppress the depth of an area in which the concentration of oxygen varies and which disturbs the electric field.

Figure 5:
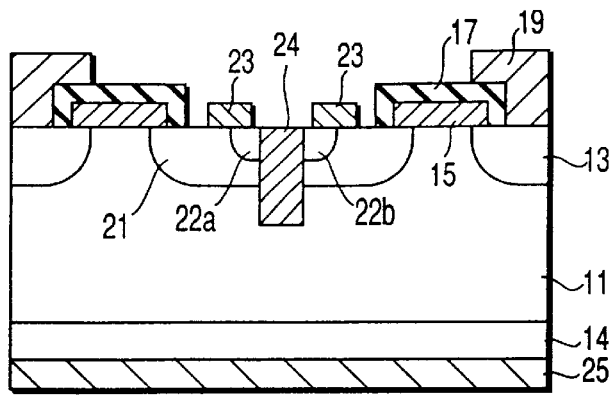
FIG. 5 is a sectional view showing a MOSFET to which the invention is applied.
Figure 6:
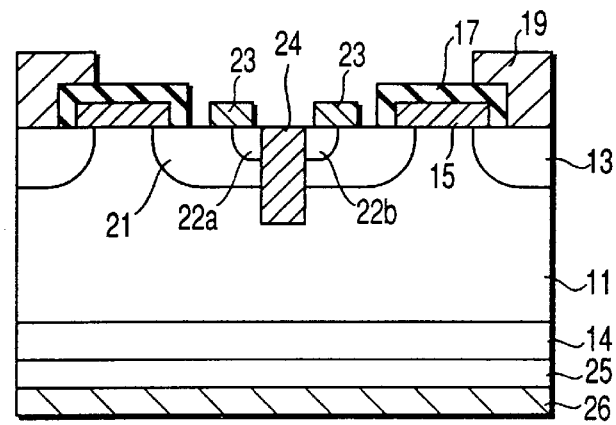
FIG. 6 is a sectional view an IGBT to which the invention is applied.
Figure 7:
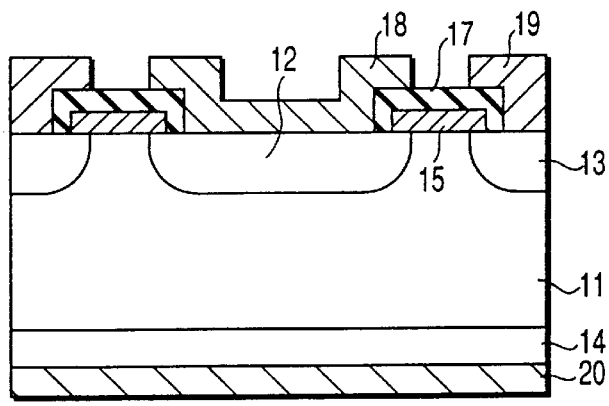
FIG. 7 is a sectional view showing a conventional semiconductor device.
Figure 8:
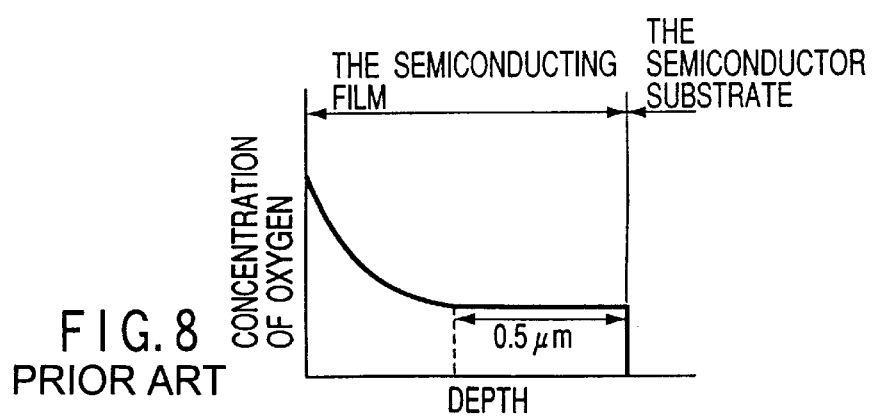
FIG. 8 is a graph relating to the conventional semiconductor device and illustrating the relationship between the concentration of oxygen and the depth of a semiconductive film from its surface.

The invention is not limited to the first and second embodiments. Although the first and second embodiments employ a diode structure, the invention is also applicable to a MOSFET structure as shown in FIG. 5 or an IGBT structure as shown in FIG. 6 if the anode layer is changed to a base layer. In the case of a MOSFET or an IGBT, the same advantage as obtained in the first and second embodiments can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

an element area of a semiconductor substrate;

an anode layer formed in a surface of the element area of the semiconductor substrate;

a channel stopper layer formed in a junction terminal section with a predetermined distance from the anode layer;

a semiconductive film formed on the semiconductor substrate between the anode layer and the channel stopper layer; and a first insulating film covering the semiconductive film, wherein an area of the semiconductive film, in which the concentration of oxygen is constant, extends from the surface of the semiconductor substrate to a distance of 1 $\mu$m or more from the surface of the semiconductor substrate.

2. A semiconductor device according to claim 1, wherein the semiconductive film is formed of a material obtained by adding at least one of oxygen, nitrogen and carbon to silicon.

3. A semiconductor device according to claim 1, wherein the semiconductive film has a specific resistance of $10^7$–$10^{13}$ $\Omega$·cm.

4. A semiconductor device according to claim 1, further comprising a second insulating film formed between the semiconductive film and the first insulating film.

5. A semiconductor device according to claim 1, further comprising a second insulating film formed between the semiconductive film and the first insulating film, and wherein the semiconductive film is formed of a material obtained by adding at least one of oxygen, nitrogen and carbon to silicon.

6. A semiconductor device according to claim 1, further comprising a second insulating film formed between the semiconductive film and the first insulating film, and wherein the semiconductive film a specific resistance of $10^7$–$10^{13}$ $\Omega$·cm.

* * * * *

UNITED STATES PATENT AND TRADEMARK OFFICE
CERTIFICATE OF CORRECTION

PATENT NO.    : 6,222,231 B1
DATED         : April 24, 2001
INVENTOR(S)   : Shingo Satou et al.

It is certified that error appears in the above-identified patent and that said Letters Patent is hereby corrected as shown below:

<u>Title page,</u>
Item [54], Title,
Line 3, after "FILM", insert a comma.

<u>Column 8,</u>
Line 51, after "semiconductive film", insert -- has --.

Signed and Sealed this

Twenty-fifth Day of June, 2002

Attest:

Attesting Officer

JAMES E. ROGAN
*Director of the United States Patent and Trademark Office*